(12) United States Patent
Lee

(10) Patent No.: US 9,250,264 B2
(45) Date of Patent: Feb. 2, 2016

(54) COAXIAL PROBE

(75) Inventor: Chae-Yoon Lee, Busan (KR)

(73) Assignee: LEENO INDUSTRIAL INC., Busan (KR)

( * ) Notice: Subject to any disclaimer, the term of this patent is extended or adjusted under 35 U.S.C. 154(b) by 146 days.

(21) Appl. No.: 14/342,024

(22) PCT Filed: Aug. 29, 2012

(86) PCT No.: PCT/KR2012/006884
§ 371 (c)(1),
(2), (4) Date: Feb. 28, 2014

(87) PCT Pub. No.: WO2013/032218
PCT Pub. Date: Mar. 7, 2013

(65) Prior Publication Data
US 2014/0203831 A1    Jul. 24, 2014

(30) Foreign Application Priority Data

Aug. 30, 2011   (KR) .................. 10-2011-0086950
Sep. 1, 2011    (KR) .................. 10-2011-0088291
Aug. 21, 2012   (KR) .................. 10-2012-0091138

(51) Int. Cl.
*G01R 1/067* (2006.01)
(52) U.S. Cl.
CPC ........ *G01R 1/06722* (2013.01); *G01R 1/06772* (2013.01)
(58) Field of Classification Search
CPC .......... G01R 1/067; G01R 1/06; G01R 31/28; G01R 31/02; G01R 27/08; H01R 43/00
USPC .................... 324/755.02, 754, 724
See application file for complete search history.

(56) References Cited

U.S. PATENT DOCUMENTS 5,003,255 A    3/1991  Kazama
6,053,777 A    4/2000  Boyle
(Continued)

FOREIGN PATENT DOCUMENTS

CN    201796054    4/2011
JP    60-123666    8/1985
(Continued)

OTHER PUBLICATIONS

Japanese Office Action with English Translation dated Dec. 3, 2014 for Japanese Application No. 2014-522761.
(Continued)

*Primary Examiner* — Tung X Nguyen
*Assistant Examiner* — Zannatul Ferdous
(74) *Attorney, Agent, or Firm* — Kile Park Reed & Houtteman PLLC

(57) ABSTRACT

Disclosed is a coaxial probe comprising, an internal conductor comprising an upper contact configured to contact a semiconductor device; a lower contact configured to contact a tester for testing the semiconductor device; and an internal elastic member configured to elastically bias at least one of the upper and lower contacts to make the upper and lower contacts distant from each other; an external conductor configured to surround the internal conductor; a plurality of gap members which is respectively inserted into opposite ends between the internal conductor and the external conductor to create a predetermined air gap between the internal conductor and the external conductor; and at least one external elastic member that is inserted into an external circumferential surface of the external conductor to elastically bias at least one of the semiconductor device and the tester to a direction that makes either the semiconductor device or the test distant from the external conductor.

14 Claims, 8 Drawing Sheets

(56) References Cited

U.S. PATENT DOCUMENTS

| | | | |
|---|---|---|---|
| 6,447,303 | B1 | 9/2002 | Kihira et al. |
| 6,652,326 | B2 | 11/2003 | Boyle et al. |
| 6,836,129 | B2 | 12/2004 | Lee |
| 7,764,072 | B2 * | 7/2010 | Strid .................. G01R 1/06772 324/149 |
| 2004/0100295 | A1 | 5/2004 | Lee |
| 2004/0178491 | A1 * | 9/2004 | Akram .................. H01L 21/486 257/686 |
| 2007/0075726 | A1 * | 4/2007 | Chan .................. G01R 1/06711 324/754.18 |
| 2010/0007365 | A1 | 1/2010 | Ishizuka et al. |
| 2011/0057664 | A1 | 3/2011 | Miyata |

FOREIGN PATENT DOCUMENTS

| | | |
|---|---|---|
| JP | 09-152447 | 6/1997 |
| JP | 2002-501289 | 1/2002 |
| JP | 2002-198107 | 7/2002 |
| JP | 2002-228682 | 8/2002 |
| JP | 2003-172747 | 6/2003 |
| JP | 2004-504703 | 2/2004 |
| JP | 2010-019797 | 1/2010 |
| KR | 20-0273185 | 4/2002 |
| KR | 10-2004-0022004 | 3/2004 |
| KR | 10-2004-0045620 | 6/2004 |
| KR | 10-2005-0109246 | 11/2005 |
| KR | 20-2009-0008319 | 8/2009 |
| KR | 10-2010-0099323 | 9/2010 |
| KR | 10-2011-0127010 | 11/2011 |
| TW | 531938 | 5/2003 |
| TW | M358968 | 6/2009 |
| TW | 201006068 | 2/2010 |
| WO | 02/07265 | 1/2002 |

OTHER PUBLICATIONS

Preliminary Notice of First Office Action for Taiwanese Application No. 101131562 dated, Apr. 25, 2014.
Chinese Office Action with English Translation for Chinese Application No. 201280041462.7, dated Jun. 1, 2015.
International Search Report for International Application No. PCT/KR2012/006884 dated Feb. 7, 2013.

* cited by examiner

COAXIAL PROBE

FIELD OF THE INVENTION

The present invention relates to a coaxial probe, and more particularly, to a coaxial probe that is configured to improve durability and productivity.

BACKGROUND ART

A semiconductor device such as a semiconductor or a wafer is subject to a predetermined testing process for determining whether the semiconductor is defective.

If the semiconductor device is used in a high frequency environment, it is subject to a high frequency test. For the high frequency test, a plurality of coaxial probes is arranged in places that correspond to respective electrode pads of the semiconductor device to apply a high frequency signal from the tester to the semiconductor device.

Such coaxial probes are required to be durable against frequently repeated tests and to be able to stably connect the semiconductor device and the tester.

Also, efforts should be made to improve productivity and the ease of assembly of downsized coaxial probes corresponding to highly-integrated semiconductor devices.

DISCLOSURE OF INVENTION

The present invention is conceived to solve the above-described problems, an aspect of which is to provide a coaxial probe that is configured to improve its durability.

Another aspect of the present invention is to provide a coaxial probe that is configured to improve productivity.

According to an aspect of one exemplary embodiment, there is provided a coaxial probe comprising, an internal conductor comprising an upper contact configured to contact a semiconductor device; a lower contact configured to contact a tester for testing the semiconductor device; and an internal elastic member configured to elastically bias at least one of the upper and lower contacts to make the upper and lower contacts distant from each other; an external conductor configured to surround the internal conductor; a plurality of gap members which is respectively inserted into opposite ends between the internal conductor and the external conductor to create a predetermined air gap between the internal conductor and the external conductor; and at least one external elastic member that is inserted into an external circumferential surface of the external conductor to elastically bias at least one of the semiconductor device and the tester to a direction that makes either the semiconductor device or the test distant from the external conductor.

The internal elastic member may comprise a first internal elastic member that is configured to elastically bias the upper contact to the semiconductor device; and a second internal elastic member that is configured to elastically bias the lower contact to the tester.

The internal conductor may further comprise a first barrel configured to accommodate the upper contact and the first internal elastic member therein; and a second barrel configured to accommodate the lower contact and the second internal elastic member therein and to be electrically connected to the first barrel.

The coaxial probe may further comprise a gap maintaining member configured to surround a contacting area between the first and second barrels to be installed in an internal circumferential surface of the external conductor so that the first and second barrels contact each other electrically and the predetermined air gap is maintained.

The internal conductor may further comprise a barrel configured to accommodate the upper contact, the lower contact and the internal elastic member therein.

The plurality of gap members may comprise a separation preventing portion configured to prevent the internal conductor from being separated from the external conductor.

The external surface of the external conductor may further comprise an engagement portion that is shaped like a screw groove to be coupled with an external elastic member.

According to an aspect of another exemplary embodiment, there is provided a coaxial probe comprising, an internal conductor comprising an upper contact configured to contact a semiconductor device; a lower contact configured to contact a tester for testing the semiconductor device; and an internal elastic member configured to elastically bias at least one of the upper and lower contacts to make the upper and lower contacts distant from each other; an external conductor configured to surround the internal conductor; a dielectric provided between the internal conductor and the external conductor; and at least one external elastic member configured to be inserted into an external circumferential surface of the external conductor to elastically bias at least one of the semiconductor device and the tester to a direction that makes either the semiconductor device or the tester distant from the external conductor.

The external conductor may surround at least a part of the dielectric, and the external elastic members are provided in opposite ends of the external conductor.

According to an aspect of another exemplary embodiment, there is provided a coaxial probe comprising, an internal conductor comprising an upper contact configured to contact a semiconductor device; a lower contact configured to contact a tester for testing the semiconductor device; and an internal elastic member configured to elastically bias at least one of the upper and lower contacts to make the upper and lower contacts distant from each other; a conductive elastic member configured to elastically bias the semiconductor device and the tester to a direction that makes the semiconductor device and the tester distant, and to surround the internal conductor and to be connected to the ground; and a dielectric provided between the internal conductor and the conductive elastic member.

The internal elastic member may comprise a first internal elastic member configured to elastically bias the upper contact to the semiconductor device; and a second internal elastic member configured to elastically bias the lower contact to the tester.

The internal conductor may further comprise a first barrel configured to accommodate the upper contact and the first internal elastic member therein; and a second barrel configured to accommodate the lower contact and the second internal elastic member therein and to be electrically connected to the first barrel.

MODES FOR CARRYING OUT THE INVENTION

Figure 1:
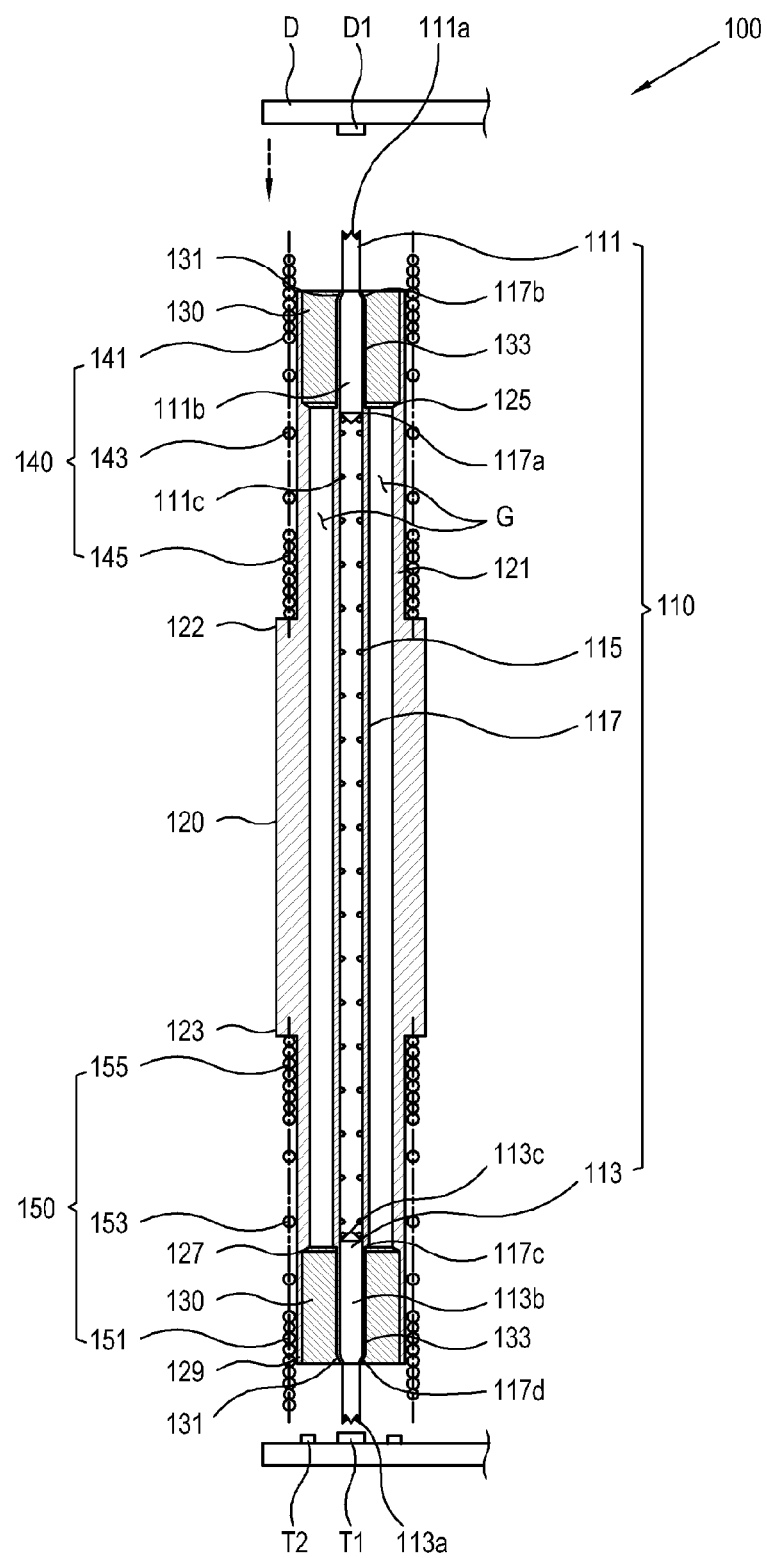
FIG. 1 is a schematic cross-sectional view of a coaxial probe according to a first embodiment.

Below, exemplary embodiments will be described in detail with reference to accompanying drawings so as to be easily realized by a person having ordinary knowledge in the art. The exemplary embodiments may be embodied in various forms without being limited to the exemplary embodiments set forth herein. Descriptions of well-known parts are omitted for clarity, and like reference numerals refer to like elements throughout.

Hereinafter, a coaxial probe according to embodiments will be described in detail with reference to accompanying drawings.

As shown in FIG. 1, a coaxial probe 100 according to a first embodiment includes an internal conductor 110 for transmitting a high frequency electric signal from a tester T to a semiconductor device D; an external conductor 120 for surrounding the internal conductor 110 to reduce signal interference; a plurality of gap members 130 that is interposed between the internal and external conductors 110 and 120 to create a predetermined air gap G between the internal and external conductors 110 and 120; and external elastic members 140 and 150 for elastically biasing at least one of the semiconductor device D and the tester T to a direction that is distant from the external conductor 120.

The internal conductor 110 includes an upper contact 111 that is capable of contacting a pad D1 of the semiconductor D; a lower contact 113 that is capable of contacting a signal terminal T1 of the tester T to test the semiconductor device D; and an internal elastic member 115 for elastically biasing at least one of the upper and lower contacts 111 and 113 to make the upper and lower contacts 111 and 113 distant from each other.

The upper contact 111 includes a tip portion 111*a* that contacts the pad D1 of the semiconductor device D; a body portion 111*b* that extends from the tip portion 111*a* to the lower contact 113; and an elastic member connection portion 111*c* that extends from the body portion 111*b* to the lower contact 113 and is connected to a first end of the internal elastic member 115.

The tip portion 111*a* may be properly modified in shape depending on a shape of the pad D1 if the pad D1 is shaped like a lead, pad or solder ball adaptively to a package type of the semiconductor device D. For example, if the pad D1 is shaped like a lead or a pad as shown in drawings, the tip portion 111*a* may be shaped like an alphabet A with a peak center on a top. If the pad D1 is shaped like a solder ball, the tip portion 111*a* may be shaped like a crown as shown in FIG. 1. Since the shape of the tip portion 111*a* is optional, the shape may vary including the aforementioned shapes.

The body portion 111*b* has a larger diameter than the tip portion 111*a* does, and may be held to a barrel 117*a* (to be described later) and/or the gap members 130. Then, when the tip portion 111*a* of the upper contact 111 is exposed to the outside toward the semiconductor device D, the upper contact 111 is prevented from being separated from the coaxial probe 100.

The lower contact 113 includes a tip portion 113*a* that contacts the signal terminal T1 through which a high frequency test signal of the tester T is output; a body portion 113*b* that extends from the tip portion 113*a* to the upper contact 111; and an elastic member connection portion 113*c* that extends from the body portion 113*b* to the upper contact 111 and is connected to a second end of the internal elastic member 115.

The tip portion 113*a* may be properly modified in shape corresponding to the shape of the signal terminal T1 of the tester T. In drawings, the tip portion 113*a* is shaped like a crown, but not limited thereto. Alternatively, the tip portion 113*a* may be shaped like an alphabet A or other shapes.

The body portion 113*b* has a larger diameter than the tip portion 113*a* does, and may be held to the barrel 117 (to be described later) and/or the gap members 130. Then, when the tip portion 113*a* of the lower contact 113 is exposed to the outside toward the tester T, the lower contact 113 is prevented from being separated from the coaxial probe 100.

The internal elastic member 115 may be a coil spring. As the case may be, the internal elastic member 115 may be a plate spring or conductive rubber. The internal elastic member 115 may be provided in other various shapes and materials as long as it may apply elastic bias to make the upper and lower contacts 111 and 114 spaced from each other.

The internal elastic member 115 may include a conductive material to transmit an electric signal from the lower contact 113 to the upper contact 111. For example, the internal elastic member 115 may include one of, or an alloy of, a conductive metal such as Al, Cu, Be and Ni. As the case may be, the internal elastic member 115 may be provided as a conductive rubber which is an insulating material such as a silicon rubber in which conductive metallic particles are provided to transmit electric signals.

If the barrel 117 which will be described later may transmit signals of the upper and lower contacts 111 and 113, the internal elastic member 115 may include an insulating material (e.g., insulating rubber or metallic spring coated with insulating material). Even if the barrel 117 includes a conductive material, the internal elastic member 115 may also include a conductive material to thereby form a signal transmission route in parallel.

The external conductor 120 may be connected to a ground terminal T2 of the tester T. Since the external conductor 120 is connected to the ground, a high frequency electric signal of the internal conductor 110 is blocked, thereby minimizing signal interference that may result from ambient high frequency signals.

The external conductor 120 may directly or indirectly contact a ground medium such as a metal block (not shown) which accommodates the coaxial probe 100 therein rather than directly contacting the ground terminal T2. As the case may be, the external conductor 120 may directly or indirectly contact a ground medium such as a ground wire. That is, the external conductor 120 may contact contacting media in various manners as long as a ground signal may be transmitted.

The external conductor 120 includes an external conductor body portion 121; and external elastic member supporting portions 122 and 123 that are formed in the external conductor body portion 121 and support the external elastic members 140 and 150.

The external elastic member supporting portions 122 and 123 may be projections that extend from the external conductor body portion 121 to a radial direction as shown in FIG. 1.

The external elastic members 140 and 150 are inserted into upper and lower ends of the external conductor body portion 121, respectively, and are held to the external elastic member supporting portions 122 and 123.

The external conductor 120 further includes gap member holders 125 and 127 for regulating movement of the plurality of gap members 130.

The external conductor 120 may further include a ground terminal contacting portion 129 that contacts the ground terminal T2 of the tester T.

The plurality of gap members 130 is inserted from opposite ends of the external conductor 120 to the inside of the external conductor 120, and are held to the gap member holders 125 and 127 that are formed in the external conductor 120.

The plurality of gap members 130 may be forcedly fitted to an internal circumferential surface of the external conductor 120.

Accommodation openings 133 are formed in the plurality of gap members 130 to accommodate the upper and lower contacts 111 and 113 therein. The tip portions 111a and 113a of the upper and lower contacts 111 and 113 pass through the accommodation openings 133 to be exposed to the outside.

The plurality of gap members 130 may include a separation preventing portion 131 which is formed by making an internal diameter of the accommodation openings 133 relatively smaller to thereby prevent separation of the upper and lower contacts 111 and 113 from the accommodation openings 133. More specifically, the accommodation openings 133 may have an internal diameter that is smaller in an end part thereof so that the body portions 111b and 113b of the upper and lower contacts 111 and 113 are not separated from the accommodation openings 133.

The plurality of gap members 130 may include Teflon. The plurality of gap members 130 may include solid-state Teflon, or insulating plastic coated with Teflon. Otherwise, the plurality of gap members 130 may include a dielectric that includes an insulating material.

As shown in FIG. 1, the external elastic members 140 and 150 may be provided in opposite ends of an external circumferential surface of the external conductor 120. As necessary, only one of the external elastic members 140 and 150 may be provided in a first end of the external circumferential surface of the external conductor 120.

The external elastic member 14 includes a supporting portion 145 that is supported by the external elastic member supporting portion 122 of the external conductor 120; an extension portion 143 that extends from the supporting portion 145 to the semiconductor device D; and a contacting portion 141 that contacts and presses the semiconductor device D.

The supporting portion 145 may compress the external circumferential surface of the external conductor 120 to prevent upward separation of the external elastic member 140. The supporting portion 145 may be an area where elastic coils are relatively dense; and the extension portion 143 may be an area where elastic coils are relatively sparse; and the contacting portion 141 may be an area where elastic coils are again dense. That is, the supporting portion 145, the extension portion 143 and the contacting portion 141 may be the areas where the elastic coils are dense, sparse and again dense, respectively.

The external elastic member 150 includes a supporting portion 155 that is supported by the external elastic member supporting portion 123 of the external conductor 120; an extension portion 153 that extends from the supporting portion 155 to the tester T; and a contacting portion 151 that contacts and presses the tester T.

The supporting portion 155 may compress the external circumferential surface of the external conductor 120 to prevent upward separation of the external elastic member 150. The supporting portion 155 may be an area where elastic coils are relatively dense; and the extension portion 153 may be an area where elastic coils are relatively sparse; and the contacting portion 151 may be an area where elastic coils are again dense. That is, the supporting portion 155, the extension portion 153 and the contacting portion 151 may be the areas where the elastic coils are dense, sparse and again dense, respectively.

The internal conductor 110 may further include a barrel 117 that accommodates the upper and lower contacts 111 and 113, and the internal elastic member 115 therein.

The barrel 117 may include an upper holder 117b to prevent upward separation of the upper contact 111, and a lower holder 117b to prevent downward separation of the lower contact 113.

The upper and lower holders 117b and 117d may be bent to a radial direction corresponding to the shape of the upper and lower contacts 111 and 113.

The barrel 117 may further include projections 117a and 117c that are formed in an external circumferential surface of the barrel 117 to prevent the barrel 117 from being separated from the gap members 130 by passing through the gap members 130.

If the upper and lower holders 117b and 117d of the barrel 117 are held to the separation preventing portion 131 of the plurality of gap members 130 and prevent the barrel 117 from being separated from the gap members 130, the projections 117a and 117c may be omitted.

The barrel 117 may include a conductive metallic material. The barrel 117 may include one of, or an alloy of, Cu, Al, Be and Ni. For example, the barrel 117 may be manufactured by using BeCu. A plating layer including a conductive material such as Au, Ag, Ni, Cu and Al may be formed in an external circumference surface of the barrel 117.

Hereinafter, a manufacturing method of the coaxial probe 100 will be described in brief. First, the internal conductor 110, the external conductor 120, the plurality of gap members 130 and the external elastic members 140 and 150 are provided.

The internal conductor 110 may be assembled by sequentially inserting the upper contact 111, the internal elastic member 115 and the lower contact 113 into the barrel 117 and then inwardly bending the opposite ends of the barrel 117 to form the upper and lower holders 117b and 117d.

Then, the gap members 130 are inserted into the first end of the external conductor 120 provided as above.

To insert the tip portions 111a or 113a of the upper contact 111 or the lower contact 113 through the accommodation openings 133 formed in the inserted gap member 130, the internal conductor 110 provided as above is inserted into the external conductor 120.

The inserted internal conductor 110 is not separated to the insertion direction of the internal conductor 110 as the barrel 117 is held to the gap member 130.

Then, the other gap member 130 is inserted in the second end of the external conductor 120 into which the internal conductor 110 has been inserted. The gap member 130 is inserted into the second end of the external conductor 120 so that the tip portions 111a and 113a of the internal conductor 110 that has been inserted into the accommodation openings 133 of the gap members 130 are exposed.

The external elastic members 140 and 150 are inserted into external circumferences in opposite ends of the external conductor 120.

As a result, the coaxial probe 110 which has an air gap G formed between the internal conductor 110 and the external conductor 120 may be assembled without difficulty.

Productivity of the coaxial probe 110 may be greatly improved since the coaxial probe 110 may be manufactured by simply providing and assembling the internal conductor 110, the external conductor 120, the gap members 130 and the external elastic members 140 and 150.

Figure 2:
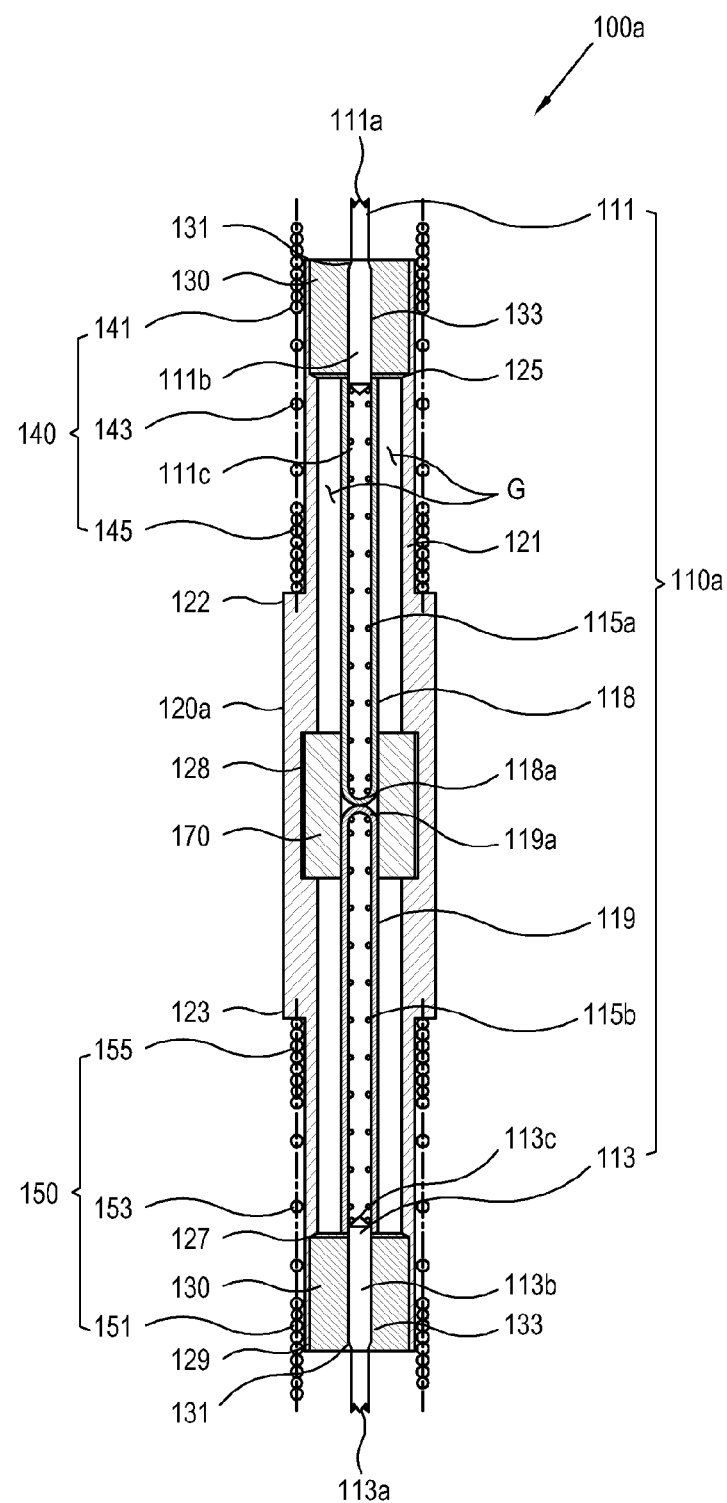
FIG. 2 is a schematic cross-sectional view of a coaxial probe according to a second embodiment.

As shown in FIG. 2, a coaxial probe 100a according to a second embodiment includes an internal conductor 110a; an external conductor 120a; the plurality of gap members 130; at least one of external elastic members 140 and 150; and a gap maintaining member 170.

The internal conductor 110a includes the upper contact 111; the lower contact 113; a first internal elastic member 115a; a second internal elastic member 115b; a first barrel 118 that accommodates the upper contact 111 and the first internal elastic member 115a therein; and a second barrel 119 that accommodates the lower contact 113 and the second internal elastic member 115b therein and is electrically connected to the first barrel 118.

The first internal elastic member 115a elastically biases the upper contact 111 toward the semiconductor device D (refer to FIG. 1).

The second internal elastic member 115b elastically biases the lower contact 113 toward the tester T (refer to FIG. 1).

As shown in FIG. 2, the first and second barrels 118 and 119 respectively include contacting portions 118a and 119a that contact each other electrically.

The gap maintaining member 170 surrounds the contacting portions 118a and 119a of the first and second barrels 118 and 119 so that the first and second barrels 118 and 119 electrically contact each other and the predetermined air gap G is maintained.

The gap maintaining member 170 is provided in an internal circumferential surface of the external conductor 120a.

Compared to the external conductor 120a according to the first embodiment, the external conductor 120a according to the second embodiment further includes a gap maintaining member supporting groove 128 that supports the gap maintaining member 170. Except for the gap maintaining member supporting groove 128, the external conductor 120a is the same as the external conductor 120 according to the first embodiment.

The gap maintaining member 170 is inserted into the gap maintaining member supporting groove 128 and thus its vertical movement is regulated.

The gap maintaining member 170 may include the same material as the plurality of gap members 130 does. For example, the gap maintaining member 170 may include Teflon dielectric. As the case may be, the gap maintaining member 170 may include an insulating dielectric with another material.

While the barrel 117 and the internal elastic member 115 of the internal conductor 110 according to the first embodiment are a single body, the barrels 118 and 119 and the internal elastic members 115a and 115b according to the second embodiment are provided in pair in a relatively short length. Thus, manufacturing costs may be reduced.

More specifically, the barrels 118 and 119 and the elastic members 115a and 115b which are relatively short in length are manufactured at lower costs and guarantee the same electrical characteristics and effects, thereby reducing manufacturing costs.

Figure 3:
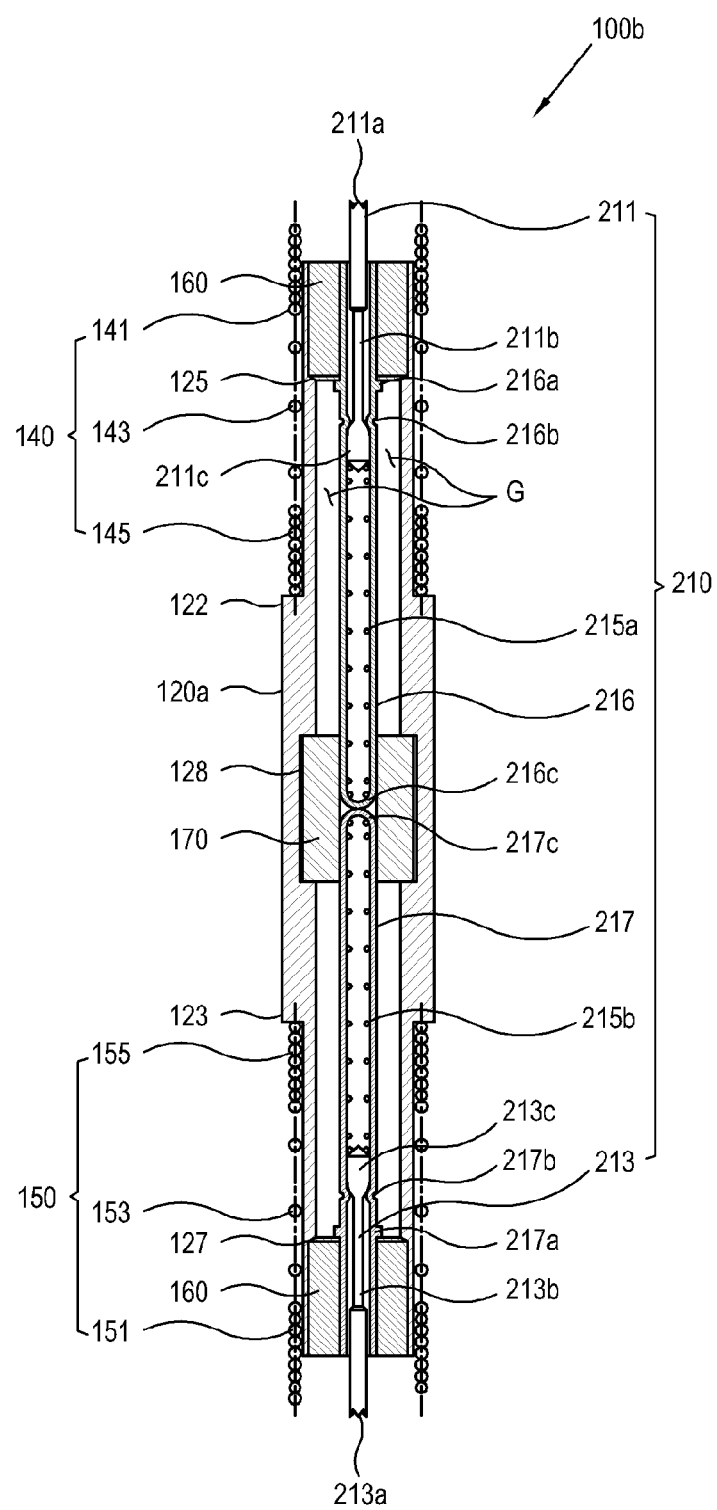
FIG. 3 is a schematic cross-sectional view of a coaxial probe according to a third embodiment.

As shown in FIG. 3, a coaxial probe 100b according to a third embodiment includes an internal conductor 210; the external conductor 120a; a plurality of gap members 160; at least one of the external elastic members 140 and 150; and the gap maintaining member 170.

The internal conductor 210 includes the upper contact 211; the lower contact 213; a first internal elastic member 215a; a second internal elastic member 215b; a first barrel 216 that accommodates the upper contact 211 and the first internal elastic member 215a therein; and a second barrel 217 that accommodates the lower contact 213 and the second internal elastic member 215b therein and is electrically connected to the first barrel 216.

The upper contact 211 includes a tip portion 211a that is capable of contacting the semiconductor device D (refer to FIG. 1); a contacting portion 211c that contacts a first end of the first internal elastic member 215a and contacts an internal circumferential surface of the first barrel 216; and a connection portion 211b that connects the tip portion 211a and the contacting portion 211c.

An external diameter of the contacting portion 211c is larger than that of the connection portion 211b.

The contacting portion 211c is held to an inward projection 216b of the first barrel 216 (to be described later). Thus, the upper contact 211 is restricted by the first barrel 216 and upward separation of the upper contact 211 is prevented.

To allow the connection portion 211b to pass through the inward projection 216b and to move vertically, an external diameter of the connection portion 211b is smaller than an internal diameter of the inward projection 216b. The length of the connection portion 211b may be properly determined by calculating the vertical moving distance of the upper contact 211 when the semiconductor device D (refer to FIG. 1) is downwardly pressed and the pad D1 (refer to FIG. 1) of the semiconductor device D contacts the upper contact 211.

The lower contact 213 includes a tip portion 213a that is capable of contacting the signal terminal T1 (refer to FIG. 1) of the tester T (refer to FIG. 1); a contacting portion 213c that contacts a first end of the second internal elastic member 215b and contacts an internal circumferential surface of the second barrel 217; and a connection portion 213b that connects the tip portion 213a and the contacting portion 213c.

An external diameter of the contacting portion 213c is larger than that of the connection portion 213b.

The contacting portion 213c is held to an inward projection 217b of the second barrel 217 (to be described later). Thus, the lower contact 213 is restricted by the second barrel 217 and an upward separation of the lower contact 213 is prevented.

The length of the connection portion 213b may be also properly determined by considering the vertical moving distance of the lower contact 213.

The first internal elastic member 215a elastically biases the upper contact 211 toward the semiconductor device D.

The second internal elastic member 215b elastically biases the lower contact 213 toward the tester T.

The plurality of gap members 160 is inserted into upper and lower ends of the external conductor 120a. The plurality of gap members 160 may be forcedly fitted to the inside of the external conductor 120a.

The first barrel 216 includes an outward projection 216a that protrudes outwardly to a radial direction to be held to the gap member 160; and an inward projection 216b that protrudes inwardly to a radial direction to be held to the contacting portion 211c of the upper contact 211.

The second barrel 217 includes an outward projection 217a that protrudes outwardly to a radial direction to be held to the gap member 160; and an inward projection 217b that protrudes inwardly to a radial direction to be held to the contacting portion 213c of the lower contact 213.

As shown in FIG. 2, the first and second barrels 216 and 217 respectively include contacting portions 216c and 217c that electrically contact each other.

The gap maintaining member 170 surrounds the contacting portions 216c and 217c of the first and second barrels 216 and 217 so that the first and second barrels 216 and 217 electrically contact each other and the predetermined air gap G is maintained.

Figure 4:
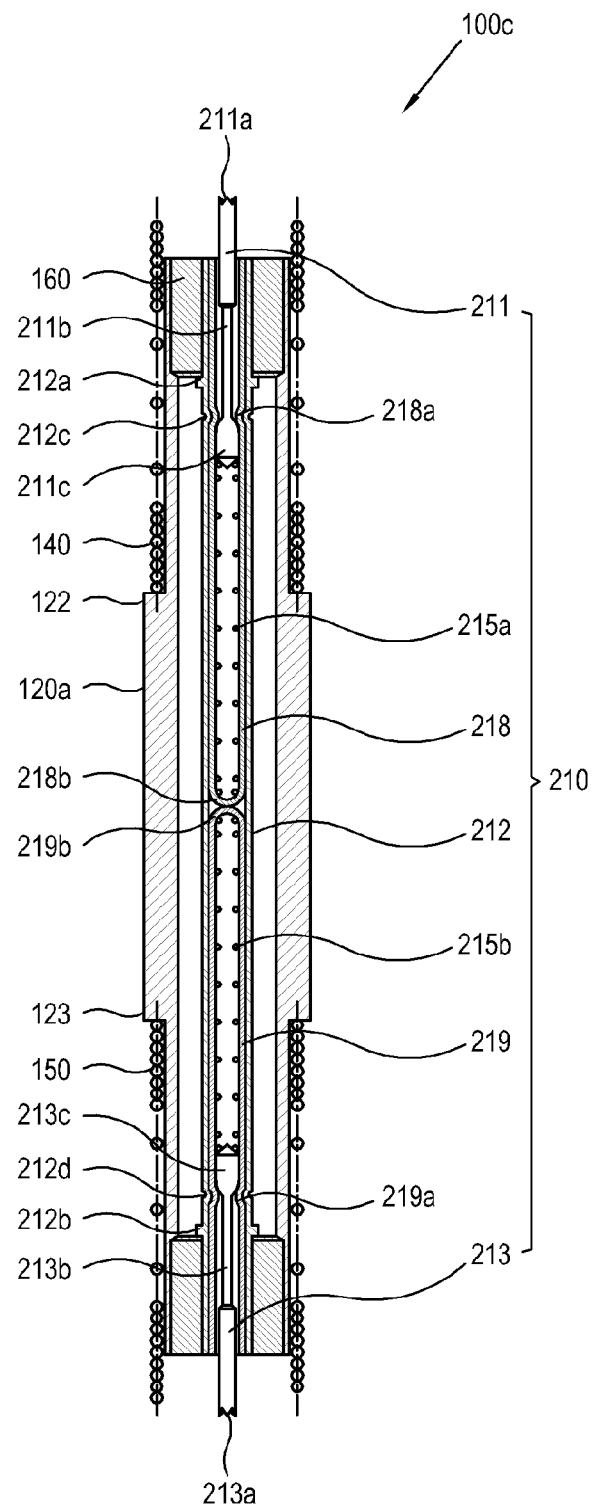
FIG. 4 is a schematic cross-sectional view of a coaxial probe according to a fourth embodiment.

As shown in FIG. 4, a coaxial probe 100c according to a fourth embodiment includes an internal conductor 210a. Compared to the coaxial probe 100b according to the third embodiment as shown in FIG. 3, the coaxial probe 100c according to the fourth embodiment includes an internal conductor 210a as shown in FIG. 4, and the gap maintaining member 170 shown in FIG. 3 is omitted from the coaxial probe 100c according to the fourth embodiment.

As shown in FIG. 4, the internal conductor 210a according to the fourth embodiment includes the upper contact 211; the lower contact 213; the first internal elastic member 215a; the second internal elastic member 215b; a first barrel 218 that accommodates the upper contact 211 and the first internal elastic member 215a therein; a second barrel 219 that accommodates the lower contact 213 and the second internal elastic member 215b therein and is electrically connected to the first barrel 218; and an external barrel 212 that accommodates the first and second barrels 218 and 219 therein.

The first barrel 218 includes an inward projection 218a that protrudes inwardly to the radial direction to be held to the contacting portion 211c of the upper contact 211.

The second barrel 219 includes an inward projection 219a that protrudes inwardly to the radial direction to be held to the contacting portion 213c of the lower contact 213.

The external barrel 212 includes a plurality of external barrel outward projections 212a and 212b that protrudes outwardly to the radial direction to be respectively held to the plurality of gap members 160 provided in the internal circumferential surface in the upper and lower ends of the external conductor 120a (refer to FIG. 3); and a plurality of external barrel inward projections 212c and 212d that is formed in corresponding locations of the inward projections 218a and 219a of the first and second barrels 218 and 219 and protrudes inwardly to the radial direction to regulate the movement of the first and second barrels 218 and 219.

The first and second barrels 218 and 219 further include contacting portions 218ba and 219b, respectively that contact each other electrically.

In the fourth embodiment, the external barrel 212 that contacts the first and second barrels 218 and 219 is added and thus the first and second barrels 218 and 219 may be more stably connected to each other electrically. More specifically, there is a first signal transmission route in which a high frequency signal input to the lower contact 213 is transmitted to the contacting portion 213c, to the second barrel 219, to the external barrel 212, to the inward projection 218a of the first barrel 218, to the contacting portion 211c of the upper contact 211 and to the tip portion 211a of the upper contact 211.

In parallel with the first signal transmission route, there is a second signal transmission route in which a high frequency signal is transmitted to the contacting portion 213c of the lower contact 213, to the inward projection 219a of the second barrel 219, to the contacting portion 219b of the second barrel 219, to the contacting portion 218b of the first barrel 218, to the inward projection 218a of the first barrel 218, to the contacting portion 211c of the upper contact 211, and to the tip portion 211a of the upper contact 211.

As above, the additional signal transmission routes are formed by the external barrel 212 and thus signals may be transmitted more stably.

Figure 5:
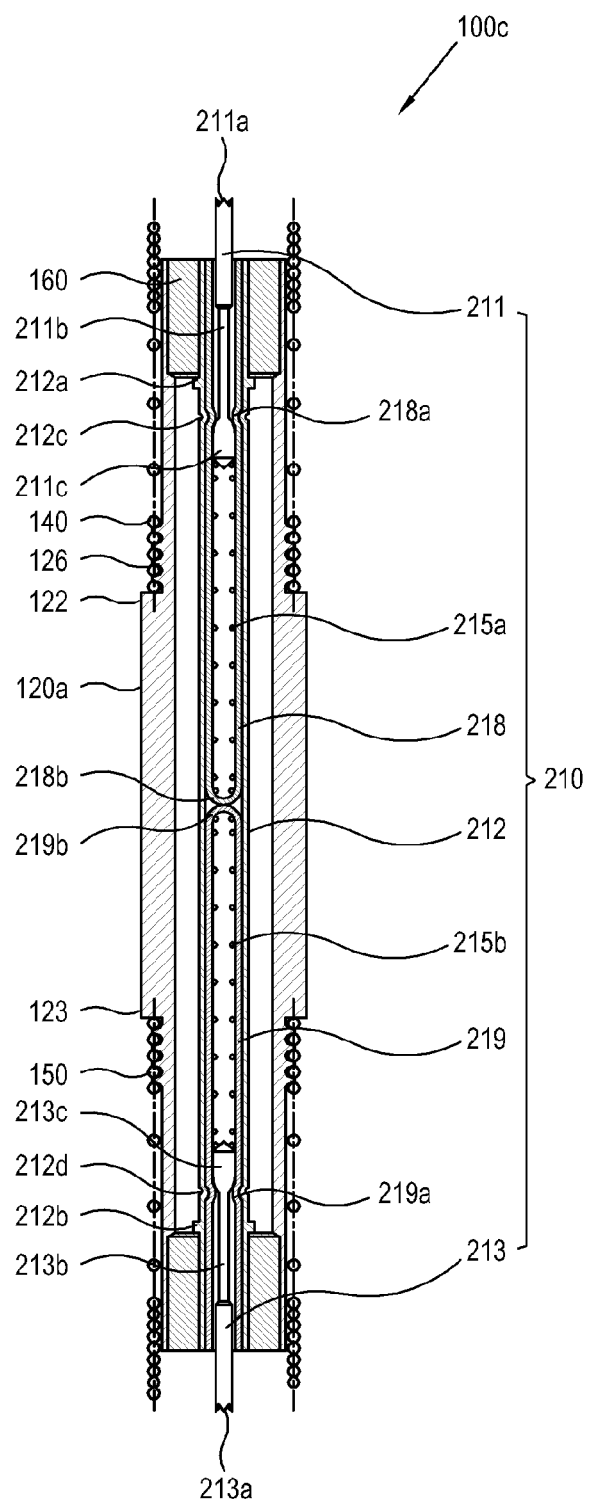
FIG. 5 is a schematic cross-sectional view of a coaxial probe according to a fifth embodiment.
Figure 6:
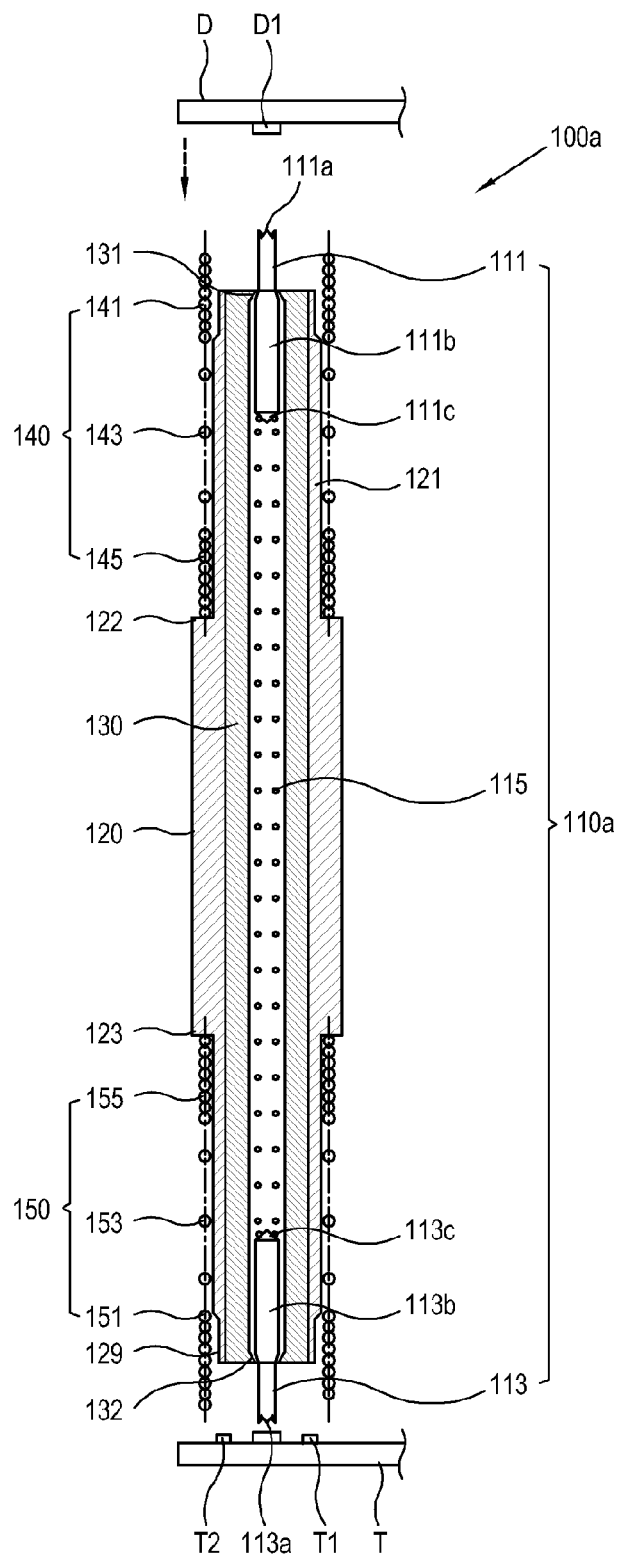
FIG. 6 is a schematic cross-sectional view of a coaxial probe according to a sixth embodiment.
Figure 7:
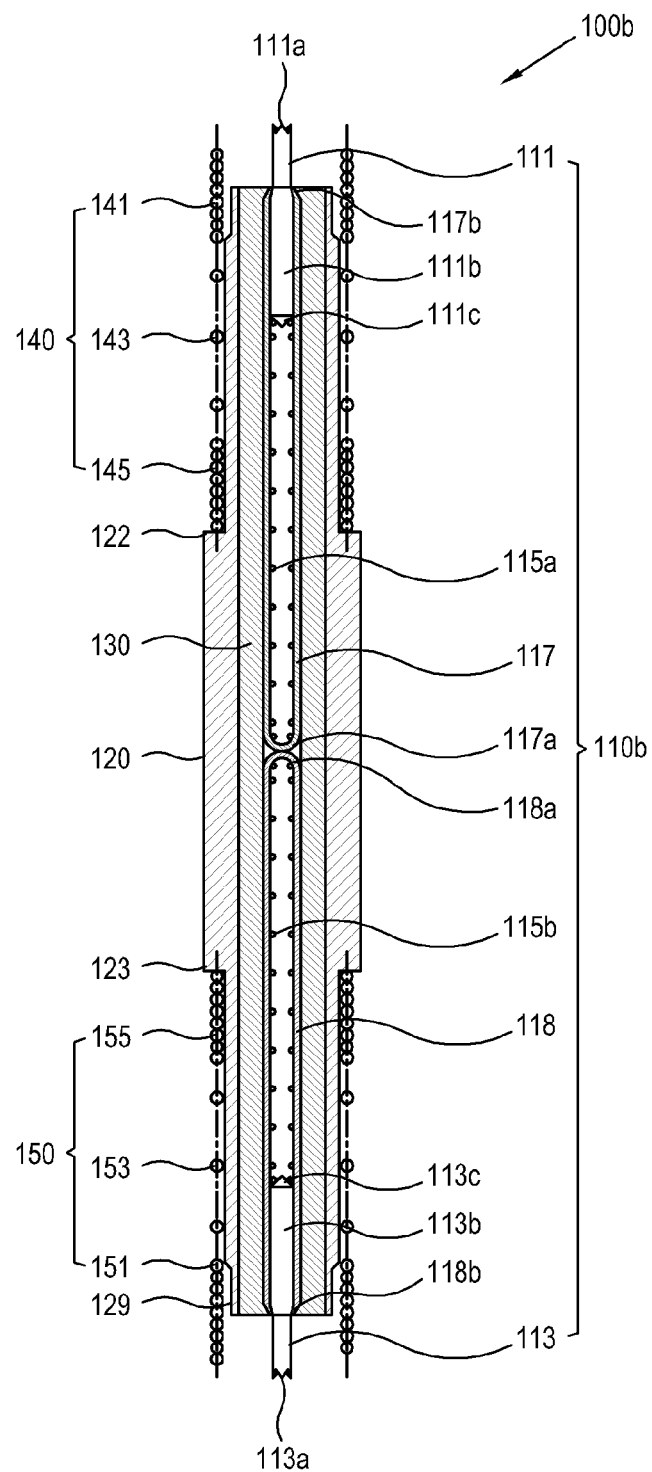
FIG. 7 is a schematic cross-sectional view of a coaxial probe according to a seventh embodiment.
Figure 8:
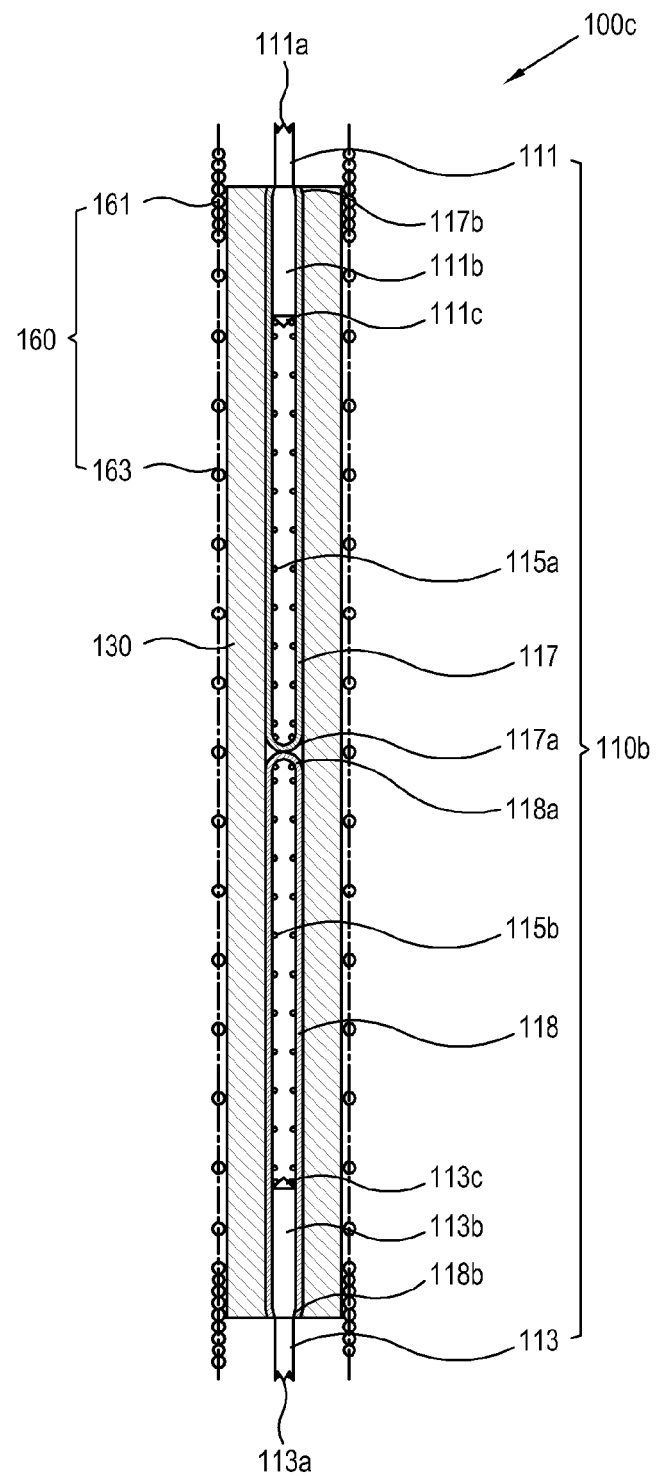
FIG. 8 is a schematic cross-sectional view of a coaxial probe according to an eighth embodiment.

As shown in FIG. 5, a coaxial probe 100c according to a fifth embodiment includes an engagement portion 126 to fix external elastic members 140 and 150 shown in FIG. 5. The engagement portion 126 may be formed as a screw groove in an external surface of the external conductor 120. The external elastic members 140 and 150 may be engaged to the engagement portion 126 that is shaped like the screw groove to be firmly coupled thereto. Accordingly, the external elastic member 140 and 150 may be conveniently and firmly fixed to the external conductor 120 without difficulty.

As shown in FIG. 1, a coaxial probe 100a according to a sixth embodiment includes an internal conductor 110a that transmits a high frequency electric signal from a tester T to a semiconductor device D; an external conductor 120 that surrounds the internal conductor 110a to reduce signal interference; a dielectric 180 that insulates the internal conductor 110a and the external conductor 120; and external elastic members 140 and 150 to elastically bias at least one of the semiconductor device D and the tester T to the direction that is distant from the external conductor 120.

The internal conductor 110a includes an upper contact 111 that is capable of contacting a pad D1 of the semiconductor device D; a lower contact 113 that is capable of contacting a signal terminal T1 of the tester T for testing the semiconductor device D; and an internal elastic member 115 that elastically biases at least one of the upper and lower contacts 111 and 113 to make the upper and lower contacts 111 and 113 distant from each other.

The upper contact 111 includes a tip portion 111a that contacts the pad D1 of the semiconductor device D; a body portion 111b that extends from the tip portion 111a toward the lower contact 113; and an elastic member connection portion 111c that extends from the body portion 111b toward the lower contact 113 and is connected to a first end of the internal elastic member 115.

The tip portion 111a may be properly modified in shape depending on a shape of the pad D1 if the pad D1 is shaped like a lead, pad or solder ball adaptively to a package type of the semiconductor device D. For example, if the pad D1 is shaped like a lead or a pad as shown in drawings, the tip portion 111a may be shaped like an alphabet A with a peak center on a top. If the pad D1 is shaped like a solder ball, the tip portion 111a may be shaped like a crown as shown in FIG. 1. Since the shape of the tip portion 111a is optional, the shape may vary including the aforementioned shapes.

The body portion 111b has a larger diameter than the tip portion 111a does and may be held to the dielectric 180. To do so, a separation preventing portion 131 may be provided in a first end of the dielectric 180. The separation preventing portion 131 may be shaped like a projection that extends from the dielectric 180, or may be coupled with an additional member to prevent separation. Thus, the upper contact 111 is prevented from being separated from the coaxial probe 100a while the tip portion 111a of the upper contact 111 is exposed to the outside toward the semiconductor device D.

The lower contact 113 includes a tip portion 113a that contacts the signal terminal T1 through which a high frequency test signal of the tester T is output; a body portion 113b that extends from the tip portion 113a to the upper contact 111; and an elastic member connection portion 113c that extends from the body portion 113b to the upper contact 111 and is connected to a second end of the internal elastic member 115.

The tip portion 113a may be properly modified in shape corresponding to the shape of the signal terminal T1 of the tester T. In drawings, the tip portion 113a is shaped like a crown, but not limited thereto. Alternatively, the tip portion 113a may be shaped like an alphabet A or other shapes.

The body portion 113b has a larger diameter than the tip portion 113a does and may be held to the dielectric 180. To do so, a separation preventing portion 132 may be provided in a second end of the dielectric 180. The separation preventing portion 132 may be shaped like a projection that extends from the dielectric 180, or may be coupled with an additional member to prevent separation. Thus, the lower contact 113 is prevented from being separated from the coaxial probe 100a while the tip portion 113a of the lower contact 113 is exposed to the outside toward the tester T.

The internal elastic member 115 may be a coil spring. As the case may be, the internal elastic member 115 may be a plate spring or conductive rubber. The internal elastic member 115 may be provided in other various shapes and materials as long as it may apply elastic bias to make the upper and lower contacts 111 and 113 spaced from each other.

The internal elastic member 115 may be provided as a conductive material to transmit an electric signal from the lower contact 113 to the upper contact 111. For example, the internal elastic member 115 may include one of, or an alloy of, a conductive metal such as Al, Cu, Be and Ni. As the case may be, the internal elastic member 115 may be provided as a conductive rubber which is an insulating material such as a silicon rubber in which conductive metallic particles are provided to transmit electric signals.

If the barrel 117 which will be described later may transmit signals of the upper and lower contacts 111 and 113, the internal elastic member 115 may be provided as an insulating material (e.g., insulating rubber or metallic spring coated with insulating material). Even if the barrel 117 is provided as a conductive material, the internal elastic member 115 may be also provided as a conductive material to thereby form a signal transmission route in parallel.

The internal conductor 110a may further include a barrel (not shown) to accommodate the upper and lower contacts 111 and 113 and the internal elastic member 115 therein.

The barrel may include an upper holder (not shown) to prevent upward separation of the upper contact 111; and a lower holder (not shown) to prevent downward separation of the lower contact 111.

The upper and lower holders may be bent to the radial direction corresponding to the shape of the upper and lower contacts 111 and 113.

The barrel may further include a projection (not shown) that is formed in an external circumferential surface of the barrel to be prevented from being separated through the dielectric 180.

If the upper and lower holders of the barrel are held to the separation preventing portion 131 of the dielectric 180 to prevent the barrel from being separated, the projection may be omitted.

The barrel may include a conductive metallic material. The barrel may include one of, or an alloy of, Cu, Al, Be and Ni. For example, the barrel may be manufactured by using BeCu. A plating layer including a conductive material such as Au, Ag, Ni, Cu and Al may be formed in an external circumferential surface of the barrel.

The external conductor 120 may be connected to a ground terminal T2 of the tester T. Since the external conductor 120 is connected to the ground, a high frequency electric signal of the internal conductor 110a is blocked, thereby minimizing signal interference that may result from ambient high frequency signals.

The external conductor 120 may directly or indirectly contact a ground medium such as a metal block (not shown) which accommodates the coaxial probe 100a therein rather than directly contacting the ground terminal T2. As the case may be, the external conductor 120 may directly or indirectly contact a ground medium such as a ground wire. That is, the external conductor 120 may contact contacting media in various manners as long as a ground signal may be transmitted.

The external conductor 120 includes an external conductor body portion 121; and external elastic member supporting portions 122 and 123 that are formed in the external conductor body portion 121 and support the external elastic members 140 and 150.

The external elastic member supporting portions 122 and 123 may be projections that extend from the external conductor body portion 121 to the radial direction as shown in FIG. 1.

The external elastic members 140 and 150 are respectively inserted into first and second ends of the external conductor body portion 121, and are held to the external elastic member supporting portions 122 and 123, respectively.

The external conductor 120 may further include a ground terminal contacting portion 129 that contacts the ground terminal T2 of the tester T.

As shown in FIG. 1, the external elastic members 140 and 150 may be provided in opposite ends of the external circumferential surface of the external conductor 120. As necessary, only one of the external elastic members 140 and 150 may be provided in a first end of the external circumferential surface of the external conductor 120.

The external elastic member 140 includes a supporting portion 145 that is supported by the external elastic member supporting portion 122 of the external conductor 120; an extension portion 143 that extends from the supporting portion 145 to the semiconductor device D; and a contacting portion 141 that contacts and presses the semiconductor device D.

The supporting portion 145 may compress the external circumferential surface of the external conductor 120 to prevent upward separation of the external elastic member 140. The supporting portion 145 may be an area where elastic coils are relatively dense; and the extension portion 143 may be an area where elastic coils are relatively sparse; and the contacting portion 141 may be an area where elastic coils are dense. That is, the supporting portion 145, the extension portion 143 and the contacting portion 141 may be the areas where the elastic coils are dense, sparse and again dense, respectively.

The external elastic member 150 includes a supporting portion 155 that is supported by the external elastic member supporting portion 123 of the external conductor 120; an extension portion 153 that extends from the supporting portion 155 to the tester T; and a contacting portion 151 that contacts and presses the tester T.

The supporting portion 155 may compress the external circumferential surface of the external conductor 120 to prevent upward separation of the external elastic member 150. The supporting portion 155 may be an area where elastic coils are relatively dense; and the extension portion 153 may be an area where elastic coils are relatively sparse; and the contacting portion 151 may be an area where elastic coils are again dense. That is, the supporting portion 155, the extension portion 153 and the contacting portion 151 may be the areas where the elastic coils are dense, sparse and again dense, respectively.

As shown in FIG. 2, a coaxial probe 100b according to a seventh embodiment includes an internal conductor 110b; an external conductor 120; a dielectric 180; and at least one of external elastic members 140 and 150.

The internal conductor 110a includes a first barrel 118 that accommodates an upper contact 111 and a first internal elastic member 115a therein; and a second barrel 119 that accommodates a lower contact 113 and a second internal elastic member 115b therein and is electrically connected to the first barrel 118.

The first internal elastic member 115a elastically biases the upper contact 111 toward the semiconductor device D (refer to FIG. 1).

The second internal elastic member 115b elastically biases the lower contact 113 toward the tester T (refer to FIG. 1).

As shown in FIG. 2, the first barrel 118 and the second barrel 119 respectively include contacting portions 118a and 119a that contact each other electrically.

The external conductor 120 and the external elastic members 140 and 150 are the same as the external conductor 120 and the external elastic members 140 and 150 according to the sixth embodiment explained above.

While the internal elastic member 115 of the internal conductor 110a according to the sixth embodiment and a barrel (not shown) that may be further included in the internal conductor 110a are a single body, the barrels 118 and 119 and the internal elastic members 115a and 115b according to the seventh embodiment are provided in pair in a relatively short length. Thus, manufacturing costs may be reduced.

More specifically, the barrels 118 and 119 and the elastic members 115a and 115b which are relatively short in length are manufactured at lower costs, and guarantee the same electrical characteristics and effects, thereby reducing manufacturing costs.

Hereinafter, a manufacturing method of the coaxial probe 100b will be described in brief. First, the internal conductor 110b, the external conductor 120, the dielectric 180 and the external elastic members 140 and 150 are provided.

The internal conductor 110b may be assembled by sequentially inserting the first internal elastic member 115a and the upper contact 111 into the first barrel 118 and then inwardly bending the opposite ends of the first barrel 118 to form the upper holder 118b. Likewise, the internal conductor 110b may be assembled by sequentially inserting the second internal elastic member 115b and the lower contact 113 into the second barrel 119 and then inwardly bending the opposite ends of the second barrel 119 to form the lower holder 119b.

To insert the tip portions 111a or 113a of the upper contact 111 or the lower contact 113 through the accommodation opening formed in the dielectric 180, the internal conductor 110b provided as above is inserted into the inside of the dielectric 180.

The internal conductor 110b is inserted into the dielectric 180 so that the tip portions 111a and 113a of the internal conductor 110b that has been inserted through the accommodation opening are exposed from the inside of the dielectric 180.

The inserted internal conductor 110b is not separated to the insertion direction of the internal conductor 110b as the first and second barrels 118 and 119 are held to the dielectric 180.

Then, the dielectric 180 is inserted into the external conductor 120.

The internal conductor 110b may be inserted into the dielectric 180 after the dielectric 180 is firstly inserted into the external conductor 120.

Then, the external elastic members 140 and 15 are respectively inserted into an external circumferential surface of the opposite ends of the external conductor 120.

Accordingly, the coaxial probe 110b which has the dielectric 180 formed between the internal conductor 110b and the external conductor 120 may be assembled without difficulty.

Productivity of the coaxial probe 110b may be greatly improved since the coaxial probe 110b may be manufactured by simply providing and assembling the internal conductor 110b, the external conductor 120, the dielectric 180 and the external elastic members 140 and 150.

As shown in FIG. 3, a coaxial probe 100c according to an eighth embodiment includes an internal conductor 110b; a dielectric 180 and at least one conductive elastic member 190.

The internal conductor 110b and the dielectric 180 are the same as the internal conductor 110b and the dielectric 180 according to the seventh embodiment explained above.

In the eighth embodiment, the conductive elastic member 180 replaces the external conductor 120 and the external elastic members 140 and 150 according to the sixth and seventh embodiments and is inserted into an external circumferential surface of the dielectric 180.

The conductive elastic member 190 elastically biases a semiconductor device D and a tester T to the direction that make the semiconductor device D and the tester D distant, and surrounds the internal conductor 110b and is connected to the ground.

The conductive elastic member 190 includes a supporting portion 193 that is supported by the dielectric 180; and a contacting portion 191 that is capable of contacting and pressing the semiconductor device D.

The supporting portion 193 may compress the external circumferential surface of the dielectric 180 to prevent separation of the conductive elastic member 190. The supporting portion 193 may be an area where elastic coils are relatively sparse; and the contacting portion 191 may be an area where elastic coils are relatively dense.

The contacting portion 191 is connected to a ground terminal T2 of the tester T. Accordingly, high frequency electric signals in the internal conductor 110b are blocked, thereby minimizing signal interference that may result from ambient high frequency signals.

The contacting portion 191 may directly or indirectly contact a ground medium such as a metal block (not shown) which accommodates the coaxial probe 100c therein rather than directly contacting the ground terminal T2. As the case may be, the contacting portion 191 may directly or indirectly contact a ground medium such as a ground wire. That is, the contacting portion 191 may contact contacting media in various manners as long as a ground signal of the conductive elastic member 190 may be transmitted.

The conductive elastic member 190 may be a coil spring. As the case may be, the conductive elastic member 190 may be a plate spring or conductive rubber. The conductive elastic member 190 may be provided in other various shapes and materials as long as it may apply elastic bias and may be connected to the ground.

The conductive elastic member 190 may include one of, or an alloy of, conductive metal such as Al, Cu, Be and Ni. As the case may be, the conductive elastic member 190 may include a conductive rubber which is an insulating material such as a silicon rubber in which conductive metallic particles are provided to transmit electric signals.

The dielectric 180 includes a dielectric body portion (not shown); and a conductive elastic member supporting portion (not shown) that is formed in the dielectric body portion and supports the conductive elastic member 190, which is the same as or similar to the external conductor 120 according to the sixth and seventh embodiments.

Like the external elastic member supporting portions 122 and 123 according to the sixth and seventh embodiments, the conductive elastic member supporting portion may include a projection that extends from the dielectric body portion 180 to the radial direction.

The conductive elastic member 190 may be plurally provided and arranged in opposite ends of the external circumferential surface of the dielectric 180 like the external elastic members 140 and 150 according to the sixth and seventh embodiments. As necessary, only one of the conductive elastic members may be provided in the first end of the external circumferential surface of the dielectric 180.

In the coaxial probe 100c according to the eighth embodiment, the conductive elastic member 190 may replace the external conductor 120 and the external elastic members 140 and 150 according to the sixth and seventh embodiments at a time, and thus ease of assembly and productivity of the coaxial probe 100c may be improved.

As described above, the coaxial probe with the foregoing configuration provides the following effects:

First, to ease the shock applied by the semiconductor device when the semiconductor device is downwardly pressed, the external elastic member is provided in addition to the internal elastic member to thereby increase buffering capability. Even if impact load is repeated, sufficient buffering capability is provided and the life and durability of the coaxial probe may be improved. In particular, as the coaxial probe is downsized due to the highly-integrated semiconductor device, the elastic force of the internal conductor alone is not sufficient. Thus, the external elastic member is added to the coaxial probe to thereby greatly improve the life of the coaxial probe.

Second, the coaxial probe may be easily assembled only by sequentially assembling the internal conductor, the gap members, the external conductor and the external elastic member and thus the ease of assembly and productivity of the coaxial probe may be improved.

Third, the coaxial probe may be manufactured only by sequentially assembling the internal conductor-dielectric-external conductor-external elastic member or by sequentially assembling the internal conductor-dielectric-conductive elastic member, and thus the ease of assembly and productivity of the coaxial probe may be improved.

Although a few exemplary embodiments have been shown and described, it will be appreciated by those skilled in the art that changes may be made in these exemplary embodiments without departing from the principles and spirit of the invention, the range of which is defined in the appended claims and their equivalents.

What is claimed is:

1. A coaxial probe comprising:
an internal conductor comprising an upper contact configured to contact a semiconductor device; a lower contact configured to contact a tester for testing the semiconductor device; and an internal elastic member configured to elastically bias at least one of the upper and lower contacts to make the upper and lower contacts distant from each other;
an external conductor configured to surround the internal conductor;
a plurality of gap members which is respectively inserted into opposite ends between the internal conductor and the external conductor to create a predetermined air gap between the internal conductor and the external conductor; and
at least one external elastic member that is inserted into an external circumferential surface of the external conductor to elastically bias at least one of the semiconductor device and the tester to a direction that makes either the semiconductor device or the test distant from the external conductor.

2. The coaxial probe of claim 1, wherein the internal elastic member comprises a first internal elastic member that is configured to elastically bias the upper contact to the semiconductor device; and
a second internal elastic member that is configured to elastically bias the lower contact to the tester.

3. The coaxial probe of claim 2, wherein the internal conductor further comprises a first barrel configured to accommodate the upper contact and the first internal elastic member therein; and
a second barrel configured to accommodate the lower contact and the second internal elastic member therein and to be electrically connected to the first barrel.

4. The coaxial probe of claim 3, further comprising a gap maintaining member configured to surround a contacting area between the first and second barrels to be installed in an internal circumferential surface of the external conductor so that the first and second barrels contact each other electrically and the predetermined air gap is maintained.

5. The coaxial probe of claim 1, wherein the internal conductor further comprises a barrel configured to accommodate the upper contact, the lower contact and the internal elastic member therein.

6. The coaxial probe of claim 1, wherein the plurality of gap members comprises a separation preventing portion configured to prevent the internal conductor from being separated from the external conductor.

7. The coaxial probe of claim 1, wherein the external surface of the external conductor further comprises an engagement portion that is shaped like a screw groove to be coupled with an external elastic member.

8. A coaxial probe comprising:
an internal conductor comprising an upper contact configured to contact a semiconductor device; a lower contact configured to contact a tester for testing the semiconductor device; and an internal elastic member configured to elastically bias at least one of the upper and lower contacts to make the upper and lower contacts distant from each other;
an external conductor configured to surround the internal conductor;
a dielectric provided between the internal conductor and the external conductor; and
at least one external elastic member configured to be inserted into an external circumferential surface of the external conductor to elastically bias at least one of the semiconductor device and the tester to a direction that makes either the semiconductor device or the tester distant from the external conductor.

9. The coaxial probe of claim 8, wherein the external conductor surrounds at least a part of the dielectric, and the external elastic members are provided in opposite ends of the external conductor.

10. A coaxial probe comprising:
an internal conductor comprising an upper contact configured to contact a semiconductor device; a lower contact configured to contact a tester for testing the semiconductor device; and an internal elastic member configured to elastically bias at least one of the upper and lower contacts to make the upper and lower contacts distant from each other;

a conductive elastic member configured to elastically bias the semiconductor device and the tester to a direction that makes the semiconductor device and the tester distant, and to surround the internal conductor and to be connected to the ground; and a dielectric provided between the internal conductor and the conductive elastic member.

11. The coaxial probe of claim 8, wherein the internal elastic member comprises a first internal elastic member configured to elastically bias the upper contact to the semiconductor device; and a second internal elastic member configured to elastically bias the lower contact to the tester.

12. The coaxial probe of claim 11, wherein the internal conductor further comprises a first barrel configured to accommodate the upper contact and the first internal elastic member therein; and a second barrel configured to accommodate the lower contact and the second internal elastic member therein and to be electrically connected to the first barrel.

13. The coaxial probe of claim 10, wherein the internal elastic member comprises a first internal elastic member configured to elastically bias the upper contact to the semiconductor device; and a second internal elastic member configured to elastically bias the lower contact to the tester.

14. The coaxial probe of claim 13, wherein the internal conductor further comprises a first barrel configured to accommodate the upper contact and the first internal elastic member therein; and a second barrel configured to accommodate the lower contact and the second internal elastic member therein and to be electrically connected to the first barrel.

* * * * *